United States Patent
Kikuchi et al.

(12) United States Patent (10) Patent No.: US 6,346,435 B1
(45) Date of Patent: Feb. 12, 2002

(54) LAMINATED SUBSTRATE FABRICATED FROM SEMICONDUCTOR WAFERS BONDED TO EACH OTHER WITHOUT CONTACT BETWEEN INSULATING LAYER AND SEMICONDUCTOR LAYER AND PROCESS OF FABRICATION THEREOF

(75) Inventors: Hiroaki Kikuchi; Tomohiro Hamajima, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/591,499

(22) Filed: Jun. 12, 2000

Related U.S. Application Data (62) Division of application No. 09/027,180, filed on Feb. 20, 1998, now Pat. No. 6,096,433.

(30) Foreign Application Priority Data

Feb. 20, 1997 (JP) ................................. 9-36437

(51) Int. Cl.[7] .......................... H01L 21/00; H01L 21/84
(52) U.S. Cl. ...................... 438/149; 438/455; 438/459
(58) Field of Search ............................... 438/406, 455, 438/459, 977, 404, 411, 412, 421, 422, 456, 218, 219, 294, 353, 400

(56) References Cited

U.S. PATENT DOCUMENTS

| | | | |
|---|---|---|---|
| 5,204,282 A | * 4/1993 | Tsuruta et al. | ............... 438/406 |
| 5,691,231 A | 11/1997 | Kobayashi et al. | ............ 437/62 |
| 5,863,386 A | 1/1999 | Vuorinen et al. | ............ 162/199 |
| 5,863,829 A | 1/1999 | Nakayoshi et al. | ......... 438/459 |
| 5,937,312 A | 8/1999 | Iyer et al. | ................... 438/459 |
| 5,953,620 A | * 9/1999 | Katou et al. | ................. 438/406 |
| 5,985,681 A | * 11/1999 | Hamajima et al. | .............. 438/8 |

FOREIGN PATENT DOCUMENTS

| | | |
|---|---|---|
| JP | 5-109677 | 4/1930 |
| JP | 3-83320 | 4/1991 |
| JP | 4-29353 | 1/1992 |
| JP | 5-21765 | 1/1993 |
| JP | 8-330554 | 12/1996 |
| JP | 2674570 | 7/1997 |

\* cited by examiner

*Primary Examiner*—Olik Chaudhuri
*Assistant Examiner*—Theresa T. Doan
(74) *Attorney, Agent, or Firm*—Foley & Lardner (57) ABSTRACT

An insulating layer is selectively grown on the major surface of a first silicon wafer, and is partially etched away so as to be retracted below the major surface; after the retraction of the insulating layer, the first silicon wafer is bonded to a second silicon wafer, and the major surface of the first silicon wafer is strongly adhered to the major surface of the second silicon wafer, so that the first silicon wafer is hardly separated from the second silicon wafer.

17 Claims, 5 Drawing Sheets

LAMINATED SUBSTRATE FABRICATED FROM SEMICONDUCTOR WAFERS BONDED TO EACH OTHER WITHOUT CONTACT BETWEEN INSULATING LAYER AND SEMICONDUCTOR LAYER AND PROCESS OF FABRICATION THEREOF

This application is a divisional application of U.S. Ser. No. 09/027,180, filed Feb. 20, 1998 now U.S. Pat. No. 6,096,433.

FIELD OF THE INVENTION

This invention relates to a laminated substrate and, more particularly, to a laminated substrate fabricated from a pair of silicon wafers bonded to each other without contact between a single crystal silicon layer and an insulating layer selectively formed on one of the silicon wafers.

DESCRIPTION OF THE RELATED ART

A laminated substrate structure such as an SOI (Silicon On Insulator) substrate is fabricated through a bonding process, and is appropriate for a semiconductor power device. The laminated substrate is available for a CMOS (Complementary Metal Oxide Semiconductor) device of the next generation.

An intelligent power integrated circuit device contains a power circuit for controlling a large amount of electric power and a peripheral circuit for controlling the power circuit, and the laminated substrate is expected to electrically isolate the peripheral circuit from the power circuit and enhance the reliability of the intelligent power integrated circuit device.

Figure 1A:
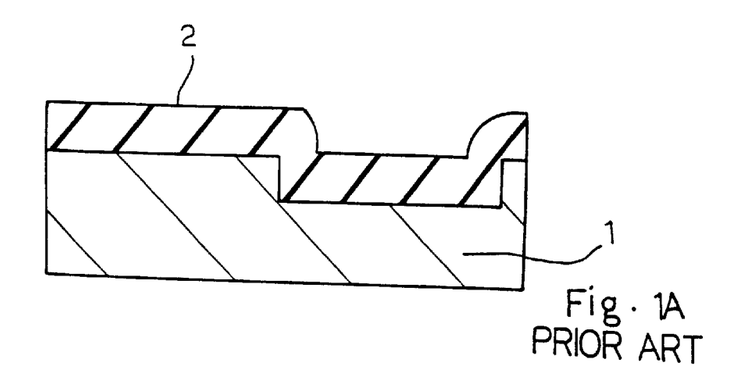
FIGS. 1A to 1C are cross sectional views showing the prior art process disclosed in Japanese Patent Publication of Unexamined Application No. 4-29353 for fabricating a laminated substrate.
Figure 1B:
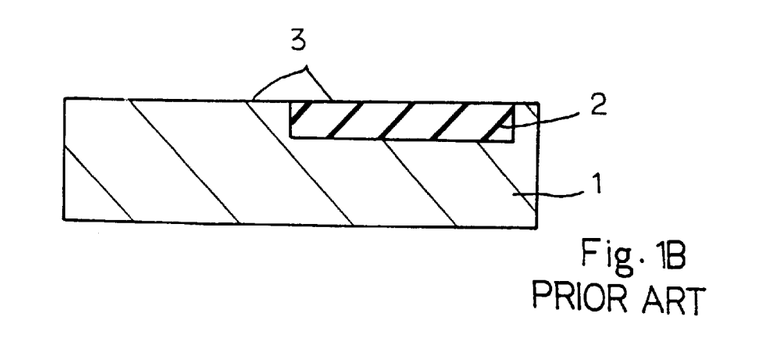
Figure 1C:
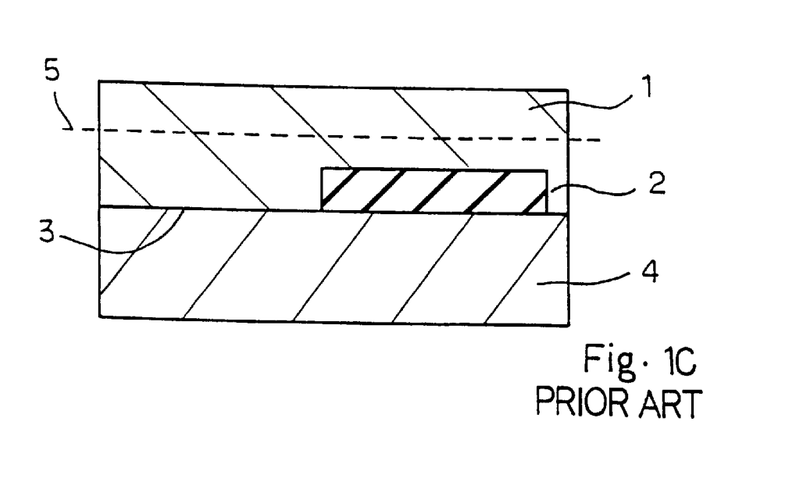

Japanese Patent Publication of Unexamined Application No. 4-29353 discloses a process of fabricating the laminated substrate, and FIGS. 1A to 1C illustrates the prior art process disclosed therein. The prior art process starts with preparation of a lightly-doped n-type silicon substrate 1. A photoresist etching mask (not shown) is patterned on the lightly-doped n-type silicon substrate 1, and the lightly-doped n-type silicon substrate 1 is selectively etched away by using a reactive ion etching technique. As a result, a shallow recess is formed in a surface portion of the lightly-doped n-type silicon substrate 1, and a step takes place between the bottom surface of the shallow recess and the major surface of the lightly-doped n-type silicon substrate 1. The photoresist etching mask is stripped off.

The lightly-doped n-type silicon substrate 1 is thermally oxidized, or silicon dioxide is deposited over the entire surface of the lightly-doped silicon substrate 1. The lightly-doped n-type silicon substrate 1 is covered with a silicon dioxide layer 2, and the silicon dioxide layer 2 conformably extends over the major surface of the lightly-doped n-type silicon substrate 1 as shown in FIG. 1A.

Subsequently, the silicon dioxide layer 2 is polished or uniformly etched until the lightly-doped n-type silicon substrate is exposed again, and tile silicon dioxide layer 2 is left in the shallow recess. The silicon dioxide layer 2 is coplanar with the lightly-doped n-type silicon substrate 1, and forms a flat surface 3 as shown in FIG. 1B.

Another heavily-doped n-type silicon substrate 4 is prepared, and the flat surface 3 is bonded to the major surface of the lightly-doped n-type silicon substrate 4 as shown in FIG. 1C. The resultant semiconductor structure is treated with heat, and the heat treatment enhances the unity. The lightly-doped n-type silicon substrate 1 is polished until broken line 5, and provides a single crystalline silicon layer With a flat major surface.

A trench isolation is formed in the prior art substrate described hereinbefore as follows. An insulating layer is formed on the flat major Surface of the single crystalline silicon layer 1, and is selectively etched so as to form an insulating pattern (not shown). Using the insulating pattern as an etching mask, alkaline etchant selectively removes the single crystalline silicon layer 1 so as to form a trench (not shown). The trench is formed between an area assigned to a vertical power transistor and an area assigned to a controlling circuit, and further divides the area assigned to the controlling circuit into active areas for fabricating circuit components.

The resultant semiconductor structure is thermally oxidized so as to grow silicon dioxide, or silicon dioxide is deposited through a low-temperature chemical vapor deposition. As a result, inner surfaces defining the trench are covered with a thin silicon dioxide layer (not shown). Polysilicon is deposited over the entire surface of the resultant semiconductor structure by using a chemical vapor deposition. The polysilicon fills the secondary trench defined by the thin silicon dioxide layer, and swells into a polysilicon layer (not shown) over the major surface of the single crystalline silicon layer. The polysilicon layer and the thin silicon dioxide layer are uniformly removed until tile single crystalline silicon layer 1 is exposed, again, by using a polishing or an etching, and the remaining silicon dioxide layer and the remaining polysilicon form a trench isolation in tile trench.

Figure 2A:
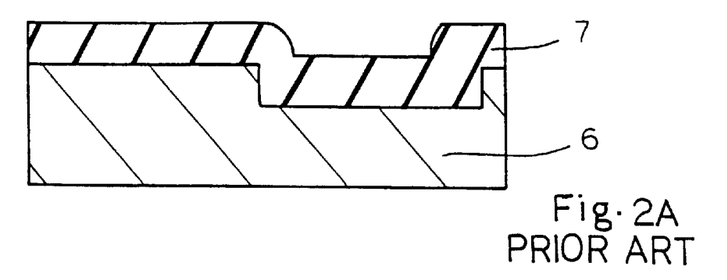
FIGS. 2A to 2C are cross sectional views showing the prior art process disclosed in Japanese Patent Publication of Unexamined Application No. 6-156451 for fabricating a laminated substrate.
Figure 2B:
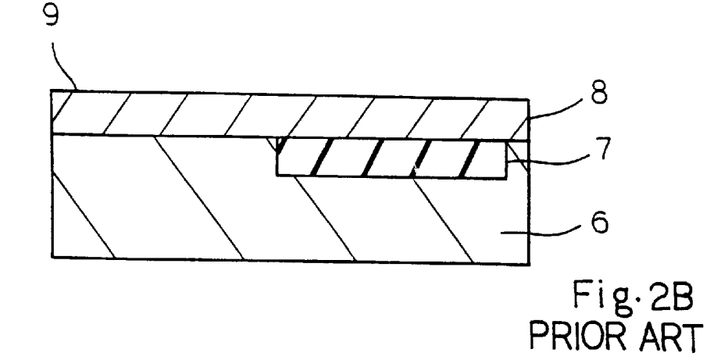
Figure 2C:
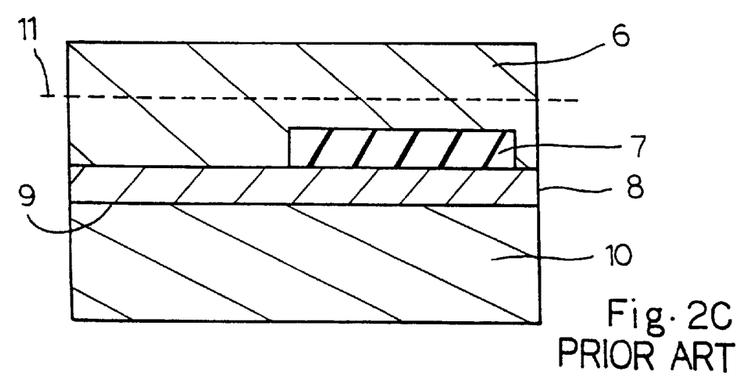

Another laminated substrate is disclosed in Japanese Patent Application No. 6-156451, and FIGS. 2A to 2C illustrate the prior art process for fabricating a laminated substrate. The process starts with preparation of a lightly-doped n-type single crystalline silicon substrate 6. The major surface of the lightly-doped n-type single crystalline silicon substrate is thermally oxidized so as to form a silicon oxide layer (not shown), which is uniform in thickness. A photoresist etching mask (not shown) is patterned on the silicon oxide layer, and the silicon oxide layer is selectively removed by using a dry etching. Thereafter, using the remaining silicon oxide layer as an etching mask, the lightly-doped n-type single crystalline silicon substrate 6 is partially etched away so as to form a shallow recess, and a step takes place between the bottom surface of the shallow recess and the major surface of the lightly-doped n-type single crystalline silicon substrate 6. The remaining silicon oxide layer is etched away.

Insulating material is deposited over the entire surface of the resultant semiconductor structure. The insulating material fills the shallow recess, and swells into an insulating layer 7 over the major surface of the lightly-doped n-type single crystalline silicon substrate 6 as shown in FIG. 2A.

The insulating layer 7 is uniformly polished or etched away until the lightly-doped n-type single crystalline silicon substrate 6 is exposed. The insulating layer 7 is left in the shallow recess, and the upper surface of the insulating layer 7 is coplanar with the major surface of the lightly-doped n-type single crystalline silicon substrate 6.

Polysilicon is deposited over the entire surface of the resultant semiconductor structure, and forms a polysilicon layer 8. The polysilicon layer 8 is polished, and a smooth surface 9 is created through the polishing as shown in FIG. 2B.

A heavily-doped n-type silicon substrate 10 is bonded to the smooth surface 9 as shown in FIG. 2C, and the lightly-doped n-type single crystalline silicon substrate 6 is polished until broken line 11 so as to regulate the lightly-doped n-type single crystalline silicon layer 6 to a target thickness.

A trench isolation is formed in the prior art substrate described hereinbefore as follows. An insulating layer is formed on the flat major surface of the single crystalline silicon layer 6, and is selectively etched so as to form an insulating pattern (not shown). Using the insulating pattern as an etching mask, alkaline etchant selectively removes the single crystalline silicon layer 6 so as to form a trench (not shown). The trench is formed between an area assigned to a vertical power transistor and an area assigned to a controlling circuit, and further divides the area assigned to the controlling circuit into active areas for fabricating circuit components.

The resultant semiconductor structure is thermally oxidized so as to grow silicon dioxide, or silicon dioxide is deposited through a low-temperature chemical vapor deposition. As a result, inner surfaces defining the trench are covered with a thin silicon dioxide layer (not shown). Polysilicon is deposited over the entire surface of the resultant semiconductor structure by using a chemical vapor deposition. The polysilicon fills the secondary trench defined by the thin silicon dioxide layer, and swells into a polysilicon layer (not shown) over the major surface of the single crystalline silicon layer. The polysilicon layer and the thin silicon dioxide layer are uniformly removed until the single crystalline silicon layer is exposed, again, by using a polishing or an etching, and the remaining silicon dioxide layer and the remaining polysilicon form a trench isolation in the trench.

The prior art laminated substrate shown in FIG. 1C encounters a problem in that a malfunction takes place in the vertical power transistor fabricated thereon. The malfunction is derived from voids between the surface of the lightly-doped n-type silicon layer 1 and the major surface of the heavily-doped n-type silicon substrate 4. The lightly-doped silicon and the silicon dioxide is different in polishing rate or etching rate, and the silicon dioxide layer 2 unavoidably projects from the major surface of the lightly-doped n-type silicon substrate 1. It is impossible for the polishing technology and the etching technology presently available to uniformly etch both semiconductor and insulating materials and, accordingly, to decrease the step less than 10 nanometers. As a result, the lightly-doped n-type silicon layer 1 is not strongly bonded to the heavily-doped n-type silicon substrate 4, and, accordingly, is liable to be separated from each other. When the void takes place between the semiconductor layers assigned to the vertical power transistor, the current is decreased.

The prior art laminated substrate shown in FIG. 2C is free from the malfunction due to the voids, because the heavily-doped n-type silicon substrate 10 is directly bonded to the smooth surface 9 of the polysilicon layer 8. However, the smooth surface 9 requires the deposition of polysilicon and the polishing, and these additional steps increase the production cost of the prior art laminated substrate.

SUMMARY OF THE INVENTION

It is therefore an important object of the present invention to provide an laminated substrate, which is low in production cost without separation between semiconductor layers.

It is also an important object of the present invention to provide a process for fabricating the laminated substrate.

To accomplish the object, the present invention proposes to retract an insulating layer from the major surface of a semiconductor layer.

In accordance with one aspect of the present invention, there is provided a semiconductor substrate used for a semiconductor device, and the semiconductor substrate comprises a first semiconductor substrate having a first major surface, an insulating layer selectively formed in the first major surface, and having an upper surface retracted from the first major surface for forming a recess and a second semiconductor substrate having a second major surface bonded to the first major surface.

In accordance with another aspect of the present invention, there is provided a process for fabricating a semiconductor substrate comprising the steps of preparing a first semiconductor substrate having a first major surface and a second semiconductor substrate having a second major surface, selectively growing an insulating layer on the first major surface, partially removing the insulating layer so as to retract an upper surface of the insulating layer from the first major surface, bonding the first major surface to the second major surface so as to obtain a composite substrate, treating the composite substrate with heat so as to enhance the bond between the first semiconductor substrate and the second semiconductor substrate and regulating the composite substrate to a target thickness.

BRIEF DESCRIPTION OF THE DRAWINGS

The features and advantages of the laminated substrate and the process will be more clearly understood from the following description taken in conjunction with the accompanying drawings in which.

DESCRIPTION OF THE PREFERRED EMBODIMENTS

FIRST EMBODIMENT

Figures 3A, 3B:
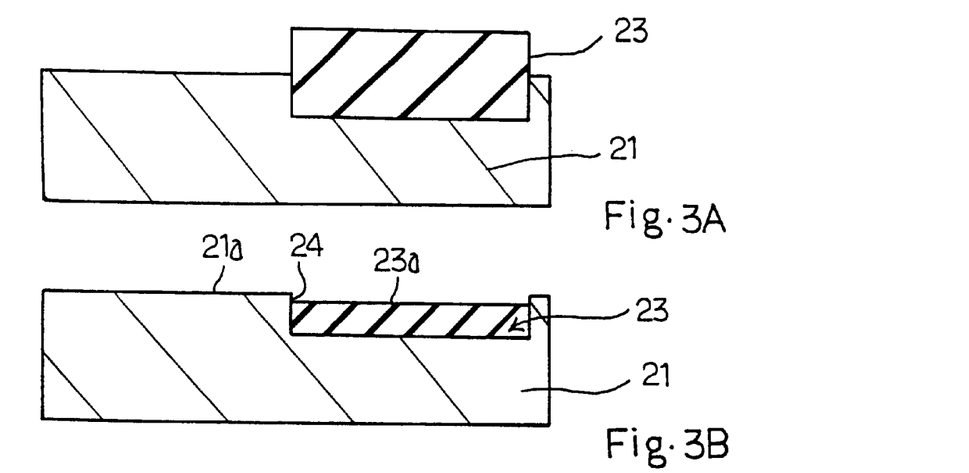
FIGS. 3A to 3D are cross sectional views showing a process for fabricating a laminated substrate according to the present invention.
Figure 4:
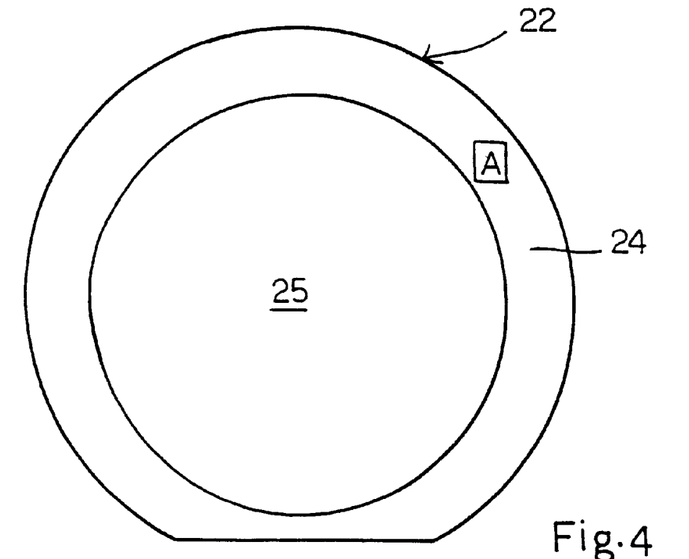
FIG. 4 is a plane view showing a silicon wafer used in the process shown in FIGS. 3A to 3D.
Figure 5:
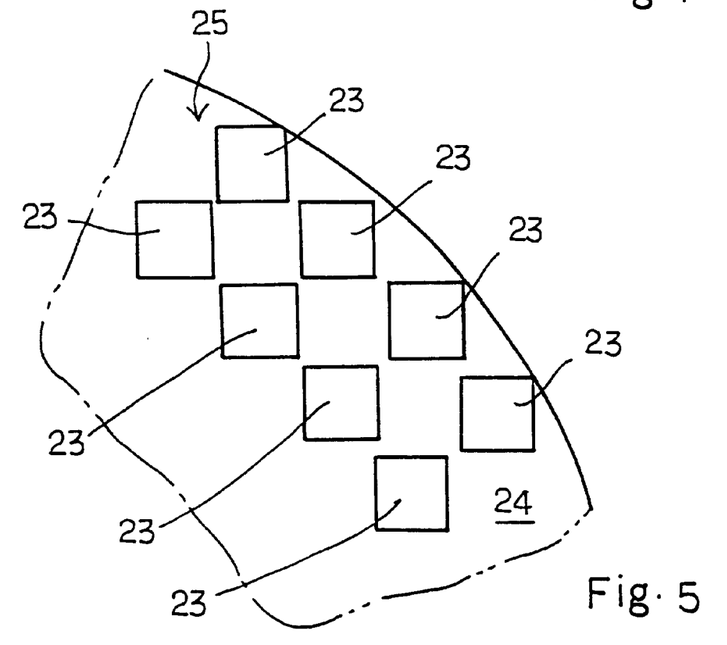
FIG. 5 is a plane view showing a part of the silicon wafer labeled with "A" in an enlarged scale.

FIGS. 3A to 3D illustrate a process for fabricating a laminated substrate embodying the present invention, and the laminated substrate is preferable for an integration of a vertical power transistor and circuit components of a peripheral circuit for controlling the vertical power transistor. The process starts with preparation of a lightly-doped n-type single crystalline silicon substrate 21. The lightly-doped n-type single crystalline silicon substrate 21 is a part of a 5-inch silicon wafer 22 (see FIG. 4), and is 1 ohm-cm in resistivity and 600 microns in thickness. Insulating layers 23 of silicon oxide are selectively grown to 2 micron thick over the major surface of the silicon wafer 24 by using the LOCOS (local oxidation of silicon) techniques. A ring-shaped peripheral area 24 is constant in width, and the insulating layers 23 form a checkered pattern 28. FIG. 5 shows area "A" in the peripheral area 24, and the checkered pattern 28 is seen. Each of the insulating layers 23 is equal to or less than 1 mm$^2$. If the insulating layers 23 are as wide as insulating layers (not shown) formed in a central area 25, the wide insulating layers 23 are causative of separation. The insulating layers in the central area 25 are several millimeters square. For this reason, the insulating layers 23 are narrower than the insulating layers in the central area 25. The resultant structure is shown in FIG. 3A.

The insulating layers 23 are etched by etching solution in the hydrofluoric acid system, and are decreased to 0.9 micron thick. The wet etching depresses down the insulating layers 23, and the upper surface 23a of each insulating layer 23 becomes lower than the major surface 21a of the lightly-doped n-type single crystalline silicon substrate 21. As a result, a step 24 takes place between the major surface 21a and the upper surface 23a, and is of the order of 0.1 micron as shown in FIG. 3B.

Figure 3C:
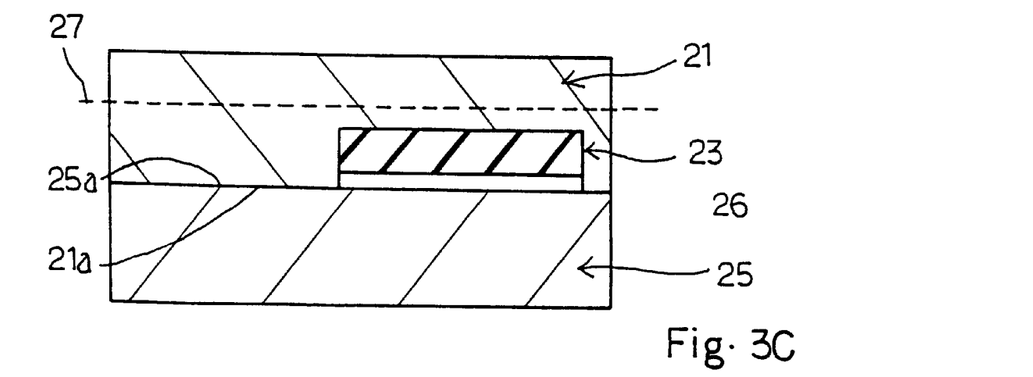
Figure 3D:
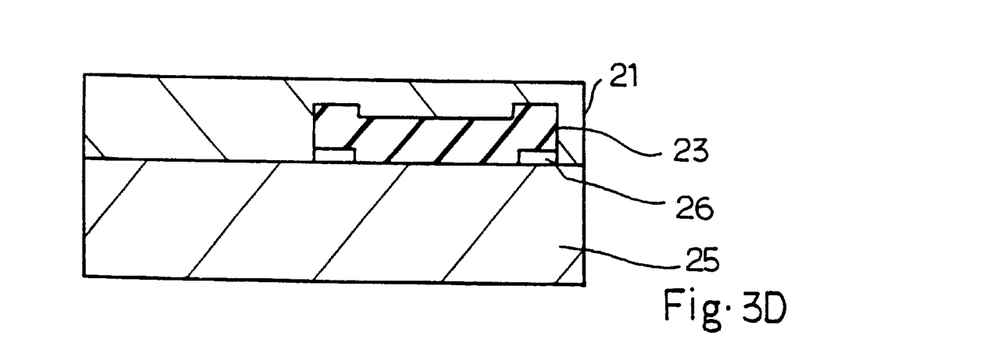

A heavily-doped n-type single crystalline silicon substrate 25 forms a part of a 5-inch silicon wafer, which is 600 nanometers in thickness and 0.01 ohm-cm to 0.02 ohm-cm in resistivity. The major surface 25a of the heavily-doped n-type single crystalline silicon substrate 25 is bonded to the major surface 21a of the lightly-doped n-type single crystalline silicon substrate 21 in the atmosphere at room temperature as shown in FIG. 3C. The bonding operation may be carried out in oxygen.

The major surfaces 21a and 25a have been polished, and, accordingly, are mirror surfaces. A hollow space 26 takes place between the insulating layer 23 and the major surface 25a of the heavily-doped n-type single crystalline silicon substrate 25, and allows the major surfaces 21a and 25a to be strongly bonded to each other. The hollow space 26 is at least 0.1 micron in depth. For this reason, the lightly-doped n-type single crystalline silicon substrate 21 is hardly separated from the heavily-doped n-type single crystalline silicon substrate 25.

The resultant semiconductor structure is treated with heat, and the heat treatment enhances the bond between the lightly-doped n-type single crystalline silicon substrate 21 and the heavy-doped n-type single crystalline silicon substrate 25. The treatment is carried out at least 1000 degrees in centigrade and, preferably between 1000 degrees to 1200 degrees in centigrade for 2 hours.

Even though the air is left between the lightly-doped n-type single crystalline silicon substrate 21 and the heavily-doped n-type single crystalline silicon substrate 25, the oxygen reacts with the silicon substrates, and the nitrogen is diffused into the silicon substrates 21/25 during the heat treatment. For this reason, air pressure is decreased.

Subsequently, the peripheral edges of the resultant semiconductor structure are chamfered, and the lightly-doped n-type single crystalline silicon substrate 21 is polished from the back surface to broken line 27 shown in FIG. 3C so as to create a mirror surface. The lightly-doped n-type single crystalline silicon layer 21 serves as an active layer. The silicon substrate 21 is thick before the polishing, and is hardly deformed. However, after the polishing, the silicon substrate 21 becomes thin, and is deformable. For this reason, when the silicon substrates 21/25 are bonded to each other, the silicon substrate 21 is deformed in such a manner as to bond entire surface of the insulating layers 23 to the substrate 25. For this reason, the insulating layers 23 are deformed as will be understood through comparison with FIG. 3D.

As will be understood from the foregoing description, the insulting layer 23 is retracted from the major surface 23a of the lightly-doped n-type single crystalline silicon substrate 21 before the bonding step, and the lightly-doped n-type single crystalline silicon substrate 21 is directly bonded to the heavily-doped n-type single crystalline silicon substrate 25. The lightly-doped n-type single crystalline silicon substrate 21 is strongly bonded to the heavily-doped n-type single crystalline silicon substrate 25, and is hardly separated therefrom. For this reason, when the intelligent power integrated circuit is fabricated on the laminated substrate, any malfunction does not take place in the vertical power transistor. Moreover, any polysilicon layer is never required for the laminated substrate, and the production cost is never increased.

SECOND EMBODIMENT

Figure 6:
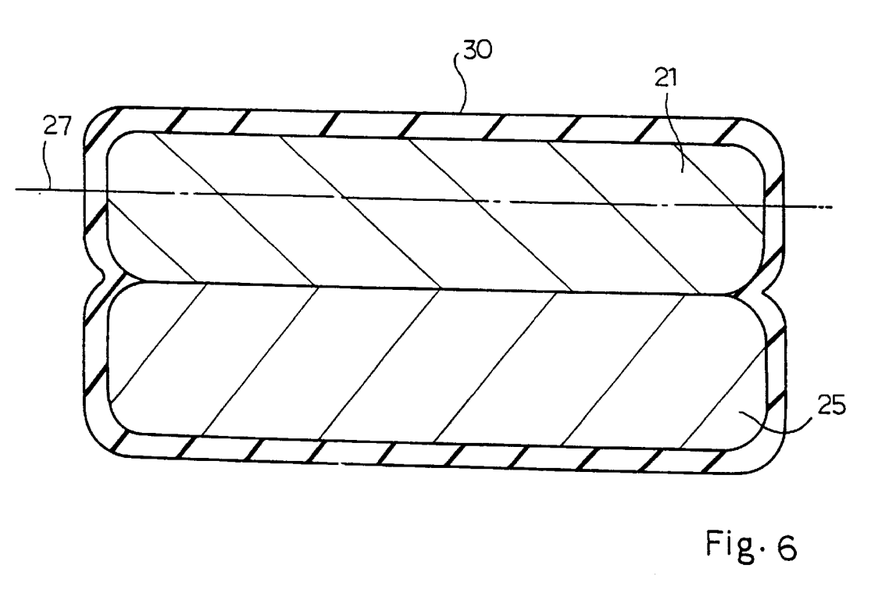
FIG. 6 is a cross sectional view showing the resultant structure of a heat treatment carried out in another process for fabricating a laminated substrate according to the present invention.

FIG. 6 illustrates an intermediate step of another process for fabricating a laminated substrate embodying the present invention. The process implementing the second embodiment is similar to the process shown in FIGS. 3A to 3D except for the step shown in FIG. 6. For this reason, description is focused on the step shown in FIG. 6.

After the heavily-doped n-type single crystalline silicon substrate 25 is bonded to the lightly-doped n-type single crystalline silicon substrate 21, the resultant semiconductor structure is also treated with heat in oxidizing atmosphere at 1000 degrees to 1200 degrees in centigrade for 2 hours. The bond is enhanced, and silicon oxide is grown to 0.15 micron thick, and the resultant semiconductor structure is wrapped in a protective layer 30 of silicon oxide as shown in FIG. 6. The protective layer 30 increases the bonding strength in the peripheral area, and the resultant semiconductor structure is hardly separated from each other during the polishing.

In this instance, the silicon dioxide is thermally grown during the enhancement of bond. The growth of silicon oxide may be separated from the enhancement of bond. For example, the bond is enhanced in non-oxidizing atmosphere, and, thereafter, the silicon oxide is grown in the oxidizing atmosphere. Moreover, the protective layer 30 may be formed through a chemical vapor deposition. Silicon oxide, silicon nitride, single crystal silicon, polysilicon or amorphous silicon may be deposited over the entire surface of the resultant semiconductor structure.

Subsequently, the lightly-doped n-type single crystalline silicon substrate 21 is polished from the back surface, and the laminated substrate is regulated to a target thickness. The polishing creates a smooth surface.

The second embodiment achieves all the advantages of the first embodiment. Moreover, it is unnecessary for the second embodiment to change the size of the insulating layers between the ring-shaped peripheral area and the central area.

THIRD EMBODIMENT

Figure 7:
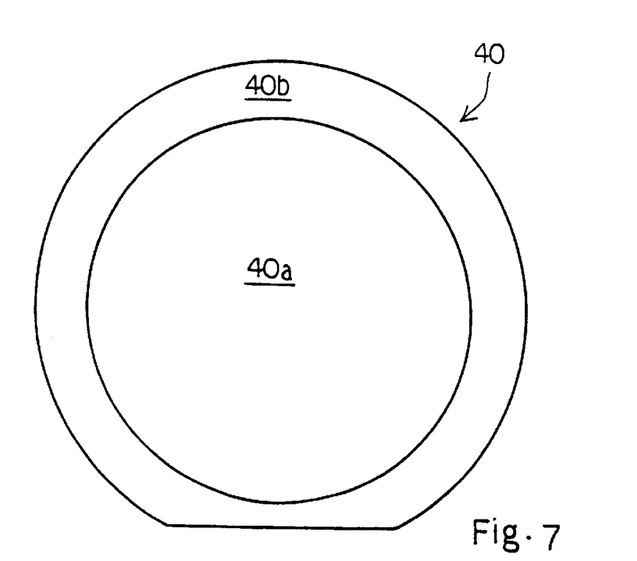
FIG. 7 is a plane view showing a single crystalline silicon wafer used in yet another process for fabricating a laminated substrate according to the present invention.

FIG. 7 illustrates a lightly-doped n-type single crystalline silicon substrate 40 used in yet another process for fabricating a laminated substrate embodying the present invention. The process implementing the third embodiment is similar to the process shown in FIGS. 3A to 3D except for a water repellent step. For this reason, description is focused on the water repellent step.

The major surface of the lightly-doped n-type single crystalline silicon substrate 40 is divided into a central area 40a and a peripheral area 40b. The central area 40a is assigned to circuit components, and the components of a controlling circuit and vertical power transistors are fabricated on the central area 40a. However, any circuit component is never fabricated on the peripheral area 40b. Although the insulating layer 23 is formed in the central area 40a, the checkered pattern 25 (see FIG. 5) is not formed in the peripheral area 40b.

The water repellent step is inserted between the retracting step and the bonding step. After retracting the insulating layer 23, the peripheral area 40b is treated with hydrogen fluoride so as to remove silicon oxide therefrom. As a result, the peripheral area 40b becomes water repellent. Suitable solution in the hydrogen fluoride system may be vaporized in order to blow the vapor to the peripheral area 40b. Thereafter, the lightly-doped n-type single crystalline silicon substrate 40 is bonded to the heavily-doped n-type single crystalline silicon substrate 25.

If the peripheral area 40b is not water repellent, the peripheral area 40 is bonded faster than the central area, because there is not the insulating pattern in the peripheral area. This results in void left in the central area. In this instance, the peripheral area 40b is water repellent, and is bonded later than the central area. For this reason, the air is easily evacuated through the peripheral area 40b, and the void is never left in the central area.

The second embodiment achieves all the advantages of the first embodiment. Moreover, any checkered pattern is not formed in the peripheral area 40b, and the peripheral area 40b is larger in mechanical strength than the peripheral area 24.

Although particular embodiments of the present invention have been shown and described, it will be obvious to those skilled in the art that various changes and modifications may be made without departing from the spirit and scope of the present invention.

For example, a pair of semiconductor substrates bonded to each other may be formed of other semiconductor material, and more than two semiconductor substrates may be bonded to one another.

What is claimed is:

1. A process for fabricating a semiconductor substrate, comprising the steps of:
   a) preparing a first semiconductor substrate having a first major surface and a second semiconductor substrate having a second major surface;
   b) selectively growing an insulating layer on said first major surface;
   c) partially removing material from an upper surface of said insulating layer that is not retracted from said first major surface so as to retract said upper surface from said first major surface;
   d) bonding said first major surface to said second major surface so as to obtain a composite substrate;
   e) treating said composite substrate with heat so as to enhance the bond between said first semiconductor substrate and said second semiconductor substrate; and
   f) regulating said composite substrate to a target thickness.

2. The process as set forth in claim 1, in which said insulating layer has a plurality of insulating sub-layers forming an insulating pattern on a peripheral area of said first major surface.

3. The process as set forth in claim 2, in which each of said plurality of insulating sub-layers is equal to or less than 1 mm$^2$.

4. The process as set forth in claim 2, wherein the insulating pattern is formed only on the peripheral area of said first major surface, and on no other portion of said first major surface, and wherein the peripheral area is on an edge of said wafer.

5. The process as set forth in claim 4, wherein said peripheral area is a ring-shaped area of constant width, which is formed on the edge of said wafer.

6. The process as set forth in claim 1, in which said insulating layer is partially etched away in said step c).

7. The process as set forth in claim 1, in which said first major surface has a peripheral area where said insulating layer is not grown, and said process further comprising the step of g) making said peripheral area water repellent between said step c) and said step d).

8. The process as set forth in claim 7, wherein only said peripheral area is treated with the hydrogen fluoride in said step g).

9. The process as set forth in claim 7, in which said peripheral area is treated with hydrogen fluoride in said step g).

10. The process as set forth in claim 9, in which said step g) includes the sub-steps of
    g-1) vaporizing said hydrogen fluoride, and
    g-2) exposing said peripheral area to the vaporized hydrogen fluoride.

11. The process as set forth in claim 1, in which said composite substrate is heated at not less than 1000 degrees in centigrade in said step e).

12. The process as set forth in claim 1, in which said composite substrate is heated at 1000 degrees to 1200 degrees in centigrade for 2 hours.

13. The process as set forth in claim 1, wherein, when the first major surface is bonded to the second major surface, an air gap is formed between said retracted upper surface of said insulating layer and said second major surface, and wherein said air gap is totally confined within a combination of said insulating layer, said first semiconductor substrate and said second semiconductor substrate.

14. A process for fabricating a semiconductor substrate, comprising the steps of:
   a) preparing a first semiconductor substrate having a first major surface and a second semiconductor substrate having a second major surface;
   b) selectively growing an insulating layer on said first major surface;
   c) partially removing material from an upper surface of said insulating layer that is not retracted from said first major surface so as to retract said upper surface from said first major surface, to form a recess therebetween; and
   d) bonding said first major surface to said second major surface so as to obtain a composite substrate.

15. The process as set forth in claim 14, further comprising:
   e) treating said composite substrate with heat so as to enhance the bond between said first semiconductor substrate and said second semiconductor substrate; and
   f) regulating said composite substrate to a target thickness.

16. The process as set forth in claim 14, further comprising:

e) polishing a top surface of said first semiconductor substrate that is not in contact with said second major surface, down to a depth wherein a width of said first semiconductor substrate directly above said insulating layer is less than a predetermined width, wherein a portion of said first semiconductor substrate deforms as a result of the width of said first semiconductor substrate directly above said insulating layer being less than the predetermined width, wherein a first portion of a lower surface of said insulating layer deforms, to form a deformed insulating layer, so as to bond directly with said second major surface of said second semiconductor substrate, and wherein a first air gap is formed beneath a second portion of said insulating layer and said second major surface, and a second air gap is formed beneath a third portion of said insulating layer and said second major surface, said first and second air gaps being separated from each other by said deformed insulating layer being disposed therebetween.

17. A process for fabricating a semiconductor substrate, comprising the steps of:

a) preparing a first semiconductor substrate having a first major surface and a second semiconductor substrate having a second major surface;

b) forming, by way of a local oxidation of silicon (LOCOS) process, an insulating layer on said first major surface, said insulating layer being formed of oxide grown through the LOCOS process;

c) partially removing material from an upper surface of said insulating layer that is not retracted from said first major surface so as to retract said upper surface from said first major surface, to form a recess therebetween; and d) bonding said first major surface to said second major surface so as to obtain a composite substrate.

* * * * *